United States Patent

Kuang et al.

Patent Number: 5,173,460
Date of Patent: Dec. 22, 1992

[54] PIEZOELECTRIC CERAMIC MATERIAL WITH LARGE POWER OUTPUT ABILITY

[75] Inventors: An-Xiang Kuang; Tao-Shen Zhou; Chang-Xin He; Li-Ying Chai; Ju-Fang Xie, all of Wuhan, China

[73] Assignee: Hubei University, Wuhan, China

[21] Appl. No.: 782,030

[22] Filed: Oct. 24, 1991

[30] Foreign Application Priority Data

Oct. 29, 1990 [CN] China .................. 90 1 08248.1

[51] Int. Cl.$^5$ ............................... C04B 35/46
[52] U.S. Cl. ................. 501/134; 252/629; 501/135; 501/136
[58] Field of Search ............ 252/62.9; 501/134, 135, 501/136

[56] References Cited

U.S. PATENT DOCUMENTS 4,062,790 12/1977 Nishida et al. .................. 22/62.9
4,753,905 6/1988 Nishioka et al. ................ 501/136
4,959,333 9/1990 Mori et al. ...................... 501/136

Primary Examiner—Karl Group
Assistant Examiner—Chris Gallo
Attorney, Agent, or Firm—Spensley Horn Jubas & Lubitz

[57] ABSTRACT

This invention relates to a piezoelectric ceramic material of a quarternary system, formulated on the basis of ternary system materials (PCM and PMN). Said quarternary system piezoelectric ceramic material consists of lead niobate with Mg (Pb (Mg$_{\frac{1}{3}}$Nb$_{\frac{2}{3}}$)O$_3$, lead niobate with Mn (Pb(Mn$_{\frac{1}{3}}$Nb$_{\frac{2}{3}}$)O$_3$), lead zirconate (PbZrO$_3$) and lead titanate (PbTiO$_3$), and possesses excellent properties for large power output purposes, and is suitable for making piezoelectric transformers of large power output. A single piece piezoelectric transformer (dimensions 100×25×36 mm3) using the material of the present invention is found to have a maximum output power of 50 W. The material according to this invention has a simple preparing process, a wider and lower sintering temperature range, is fine and compact in ceramic structure, and has a high rate of success of finished products.

2 Claims, 3 Drawing Sheets

PIEZOELECTRIC CERAMIC MATERIAL WITH LARGE POWER OUTPUT ABILITY

BACKGROUND OF THE INVENTION

This invention relates to a new piezoelectric ceramic material.

Piezoelectric transformers made of piezoelectric ceramic materials have attracted great attention from the public, due to their excellent high voltage performance, such as high voltage step-up ratio, small dimensions, light weight, and high break-down voltage, as well as their being not destructible by short circuit, using no metallic material, being damp-proof, causing no electromagnetic disturbance, etc.. Endeavours have been made to continuously improve the properties of the existing piezoelectric ceramic materials of binary system (PZT), ternary (PCM, PSM), or their varieties. However, some properties, such as temperature characteristic, mechano-electric coupling coefficient, mechanical quality factor, mechanical strength, etc., can not yet satisfy the requirement of large power output, and it is impossible to make with such materials a piezoelectric transformer having a single-piece output power higher than 40 W. To give a few examples, the highest output power of a piezoelectric transformer produced by the Sumitomo Electric Company of Japan is 40 W (see Kawata Yoshikawo, "Electric Expectation" Vol. 7(1970), No. 5, P. 67); the highest output power of a piezielectric transformer using improved PCM material produced by the Shandong University of China is 19 W (see Zhu Feng-Zhu, "Physics", Vol. 2 (1973), No. 4, pp. 183–190); and the highest output power of a piezielectric transformer using PSM material produced by the Qinhua University of China is 5.6 W (see "Ferroelectrics", Vol. 28, (1980), pp. 402–406).

SUMMARY OF THE INVENTION

The primary object of the present invention is to provide a new piezoelectric ceramic material with considerable improvement achieved in its temperature characteristic, mechano-electric coupling coefficient, mechanical quality factor and mechanical strength, so that it can satisfy the requirement for producing piezoelectric transformers with a large power output ability.

The above-mentioned object is realized by combining the ternary system material PCM (consisting of lead niobate with Mg, lead zirconate and lead titanate) and the ternary system material PMN (consisting of lead niobate with Mn, lead zirconate and lead titanate), which are of different properties, to formulate a quarternary system piezoelectric ceramic material PMMN (consisting of lead niobate with Mg, lead niobate with Mn, lead zirconate and lead titanate). The formulation of this material is as follows:

wherein:
A = 0.025–0.125;
B = 0.025–0.125;
C = 0.375–0.475;
D = 0.375–0.475.

In order to further improve the thermo-stability of the said material, $CeO_2$ and Sr are added to partially substitute Pb so as to improve its properties. The adding and substituting quantities are as follows:

$$0.1 < CeO_2 < 0.5 \text{ (wt \%)}$$

$$2 < Sr < 10 \text{ (gram atom \%)}$$

DESCRIPTION OF THE INVENTION

A preferred embodiment of the present invention will be given below, by referring to the attached drawings wherein.

Figure 1:
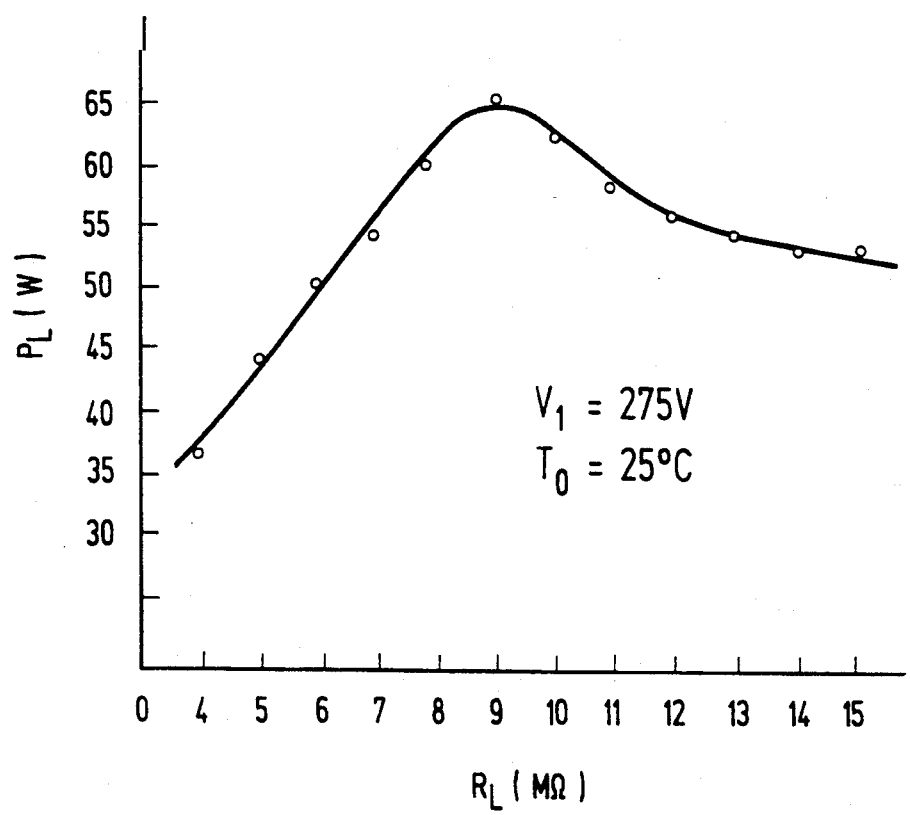
FIG. 1 illustrates a characteristic curve of output power versus load impedance, in respect of the PMMN piezoelectric ceramic material according to the present invention.
Figure 2:
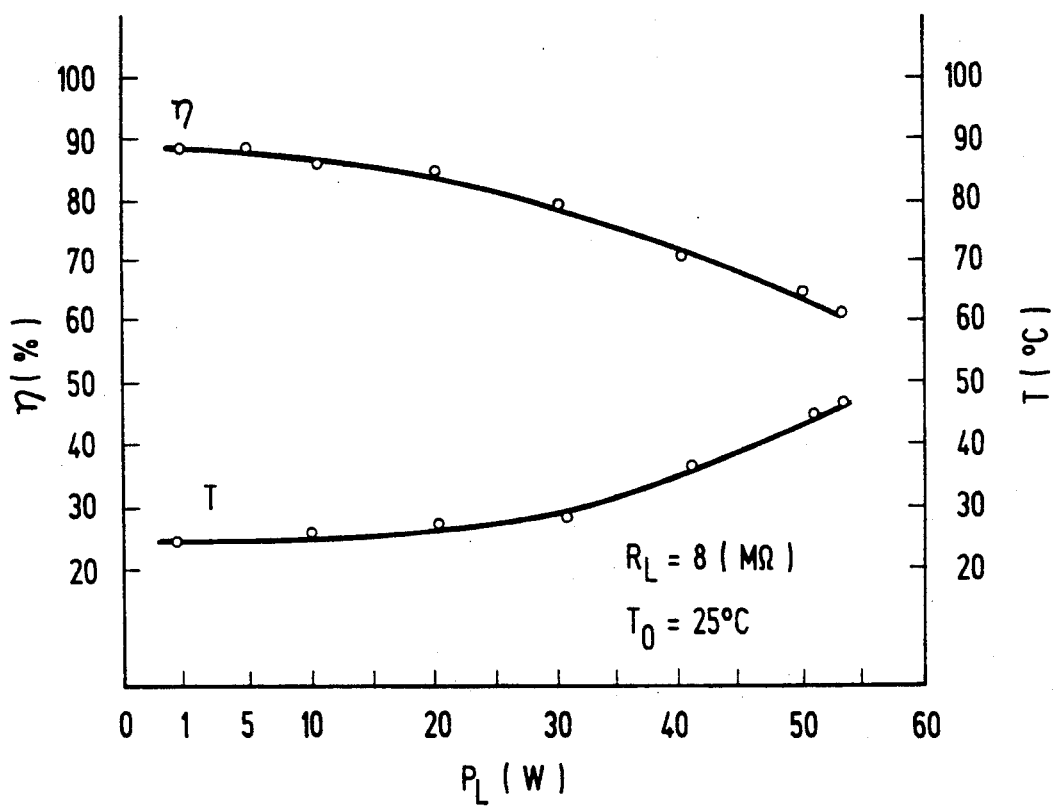
FIG. 2 shows the response characteristics of transducing efficiency and wave node temperature versus load for the said material.
Figure 3:
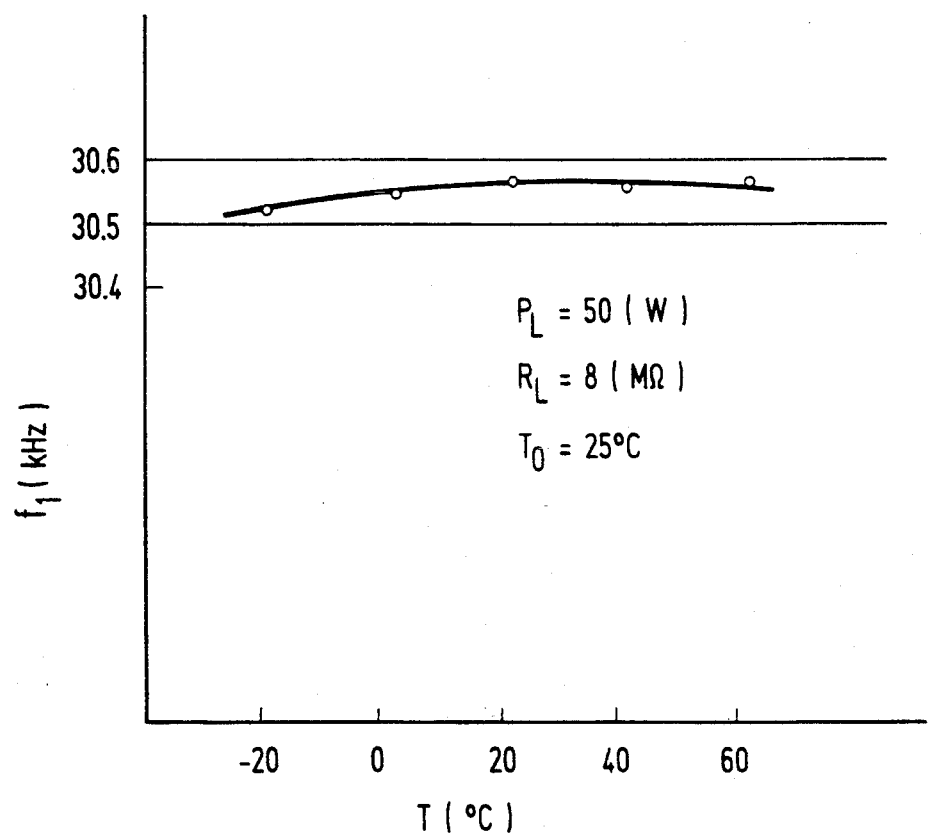
FIG. 3 shows the response characteristic of resonance frequency versus environmental temperature for the said material.

The PMMN-1 formulation according to this invention is formulated by selecting A = 0.059, B = 0.066, C = 0.459, D = 0.416, $CeO_2$ = 0.2 wt %, and Sr = 2 gram atom %. The preparing process of this material is as follows: after weighing all ingredients according to predetermined proportions, all the components are mixed within a ball grinder for 24 hrs.; the mixed components are then subjected to a pre-sintering under a constant temperature of 900° C. for two hrs., to formulate a kind of metallic compound block material; said sintered block material is then fine ground within a ball grinder for 48 hrs.; then add in a certain quantity of adhesive (such as polyvinyl alcohol). The material thus obtained is further shaped under a pressure of 3000 kg/cm2, and then sintered for 2 hrs. (said sintering process can be carried out within a relatively wide temperature range between 1190° C. and 1250° C.). The sintered pieces are then attached to silver electrodes and polarized with a polarizing voltage of 4 kv/mm for 10 minutes. After 24 hours' time, the finished pieces are finally put to a property test.

The properties of the piezoelectric ceramic material according to PMMN-1 formulation are illustrated in Table 1 below.

TABLE 1

Properties of the Piezoelectric Ceramic Material according to PMMN-1 Formulation

| Kp | K31 | K33 | Qm | $\epsilon^T_{33}/\epsilon_{33}$ | tg δ | ρ g/cm³ | d33 $10^{-12}$ C/N | d31 | g33 $10^{-3}$ V·m/N | g31 | E S11 $10^{-12}$ m²/N | D S11 |
|---|---|---|---|---|---|---|---|---|---|---|---|---|
| 0.64 | 0.31 | 0.73 | 3500 | 1280 | 0.002 | 7.8 | 311 | −110 | 30.1 | −10.7 | 11.4 | 10.3 |

The above-mentioned test results were obtained on single pieces with dimensions of 100×25×3.6 mm3. The material has a high mechanical strength; its folding resistance is about 1400 kg/cm2.

Comparisons between the piezoelectric ceramic material of this invention and other existing piezoelectric ceramic materials are illustrated in Table 2; and comparisons of the performances of piezoelectric transformers using the material of this invention and other materials are illustrated in Table 3.

It can be seen from such comparisons that the properties of the present piezielectric ceramic material, such as its thermo-stability, mechano-electric coupling coefficient, mechanical quality factor, mechanical strength, etc., have been considerably improved. Therefore, it is suitable for making piezoelectric transformers with a large output power. When the dimensions of a single piece are $100 \times 25 \times 3.6$ mm$^3$, the highest output power can reach 65 W, and its normal continuous output power is 50 W. The present material is also suitable for other large power electric appliances.

TABLE 2

Comparison of Main Properties of Materials for Piezoelectric Ceramic Transformers Domestic and Abroad

| Name of Institute | Properties | | | | | |
|---|---|---|---|---|---|---|
| | Density g/cm3 | Mechanoelectric coupling coefficient Rp | Mechanical quality factor Qm | Dielectric constant $\epsilon_{33}/\epsilon_0$ | Medium loss tg | Curie temp. Tc(°C.) |
| Hubei Univ (PMMN) | 7.8 | 0.64 | 3500 | 1280 | 0.002 | 350 |
| Shandong Univ. (PCM-98) | 7.88 | 0.6 | 1100 | 1700 | 0.007 | 300 ± 10 |
| Qinghua Univ. (PMS) | 7.62 | 0.64 | 2825 | 1394 | 0.0075 | 310 |
| Shibaura (Japan) (TPM-30) | 7.7 | 0.52 | 560 | 900 | | 310 |
| Sumitomo (Japan) (PZT) | 7.55 | 0.56 | 550 | 1000 | | 310 |

TABLE 3

Performance Comparisons of Piezoelectric Transformers Using Different Materials Listed in Table 2

| | Max. Output Power (W) | Idle Step-up Ratio (AC) | Conversion Efficiency (%) | Dimensions (mm) |
|---|---|---|---|---|
| USA | <5 | | | |
| Japan | <40 | 300 | 80 | 110 × 30 × 5 |
| Shandong Univ. | <19 | 450 | 88 | 120 × 30 × 2 |
| Qinhua | <5.7 | 150-200 | 85 | 120 × 26 × 3 |
| Univ. Hubei Univ. | 65 | 780 | 92 | 100 × 25 × 3.6 |

What is claimed is:

1. A piezoelectric ceramic material with a large power output ability, said material being a quarternary system PMMN, consisting of lead niobate with Mg(Pb(Mg$_\frac{1}{3}$Nb$_\frac{2}{3}$)O$_3$), lead niobate with Mn(Pb(Mn$_\frac{1}{3}$Nb$_\frac{2}{3}$)O$_3$), lead zirconate (PbZrO$_3$), and lead titanate (PbTiO$_3$), and its formulation being as follows:

$$Pb(Mg_\frac{1}{3}Nb_\frac{2}{3})_A(Mn_\frac{1}{3}Nb_\frac{2}{3})_B Ti_C Zr_D O_3$$

wherein:
A=0.025-0.125;
B=0.025-0.125;
C=0.375-0.475;
D=0.375-0.475.

2. A piezoelectric ceramic material according to claim 1, wherein a certain quantity of CeO2 and Sr is added to improve its properties, the added quantity being:

0.1<CeO2<0.5 (weight %)

2<Sr<10 (gram atom %).

* * * * *